(12) United States Patent
Tipple et al.

(10) Patent No.: US 10,727,224 B1
(45) Date of Patent: Jul. 28, 2020

(54) DECOUPLING CAPACITORS USING REGULARITY FINFET STRUCTURES AND METHODS FOR MAKING SAME

(71) Applicant: NXP USA, Inc., Austin, TX (US)

(72) Inventors: David Russell Tipple, San Jose, CA (US); Mark Douglas Hall, San Jose, CA (US); Anis Mahmoud Jarrar, San Jose, CA (US)

(73) Assignee: NXP USA, Inc., Austin, TX (US)

( * ) Notice: Subject to any disclaimer, the term of this patent is extended or adjusted under 35 U.S.C. 154(b) by 1 day.

(21) Appl. No.: 16/380,940

(22) Filed: Apr. 10, 2019

(51) Int. Cl.
| | |
|---|---|
| *H01L 27/06* | (2006.01) |
| *H01L 27/088* | (2006.01) |
| *H01L 29/78* | (2006.01) |
| *H01L 21/8234* | (2006.01) |
| *H01L 29/94* | (2006.01) |
| *H01L 49/02* | (2006.01) |
| *H01L 23/522* | (2006.01) |
| *H01L 29/66* | (2006.01) |
| *H01L 23/528* | (2006.01) |

(52) U.S. Cl.
CPC .. *H01L 27/0629* (2013.01); *H01L 21/823431* (2013.01); *H01L 21/823475* (2013.01); *H01L 23/5223* (2013.01); *H01L 23/5286* (2013.01); *H01L 27/0886* (2013.01); *H01L 28/86* (2013.01); *H01L 28/90* (2013.01); *H01L 29/66181* (2013.01); *H01L 29/7851* (2013.01); *H01L 29/94* (2013.01)

(58) Field of Classification Search
CPC ..... H01L 28/86; H01L 27/0629; H01L 29/94; H01L 23/5223; H01L 21/823431; H01L 29/7851; H01L 27/0886; H01L 23/5286; H01L 29/66181; H01L 28/90; H01L 21/823475
See application file for complete search history.

(56) References Cited

U.S. PATENT DOCUMENTS

| | | | |
|---|---|---|---|
| 8,860,148 B2 | 10/2014 | Hu et al. | |
| 9,337,254 B1 | 5/2016 | Basker et al. | |
| 9,455,250 B1 * | 9/2016 | Cheng | ................. H01L 29/0847 |
| 9,768,161 B2 | 9/2017 | Zhang et al. | |
| 10,497,794 B1 * | 12/2019 | Jarrar | ..................... H01L 28/86 |
| 10,566,268 B1 * | 2/2020 | Hall | .................... H01L 21/4825 |
| 10,673,435 B2 * | 6/2020 | Onyema | ............ H03K 19/0013 |

(Continued)

FOREIGN PATENT DOCUMENTS

WO          2014039558 A1          3/2014

*Primary Examiner* — Savitri Mulpuri

(57) ABSTRACT

A semiconductor apparatus includes a first device cell and a second device cell. The first device cell includes a first active region including a first set of device fins, an insulator layer disposed over the first set of device fins, a first gate fin over the first set of fins, and a first edge fin disposed over a first edge of the first active region. The second device cell is adjacent the first device cell and includes a second active region including a second set of device fins, the insulator layer disposed over the second set of device fins, a second gate fin over the second set of device fins, and a second edge fin disposed over a second edge of the second active region. The first edge fin and the second edge fin are connected to a power rail, a ground rail, or to each other to define a capacitor between the first device cell and the second device cell.

14 Claims, 15 Drawing Sheets

(56) References Cited

U.S. PATENT DOCUMENTS

| | | |
|---|---|---|
| 2003/0193058 A1 | 10/2003 | Fried et al. |
| 2013/0113072 A1 | 5/2013 | Liu et al. |
| 2013/0193500 A1 | 8/2013 | Chen |
| 2013/0200449 A1* | 8/2013 | Chen .................. H01L 27/1211 257/296 |
| 2017/0104106 A1 | 4/2017 | Chen |

* cited by examiner

DECOUPLING CAPACITORS USING REGULARITY FINFET STRUCTURES AND METHODS FOR MAKING SAME

BACKGROUND

With increasing consumer and business demand for electronics and interconnectivity, there is greater demand for increased processing power. Such increased processing power can be derived from increased processor clock speeds, increased device complexity, and improved device reliability.

One technology supporting these improvements is FinFET technology in which a gate is placed on two or three sides of a channel or wrapped around the channel. Using FinFETs, switching times can approach 10 ps or less, which corresponds to a primary frequency of 100 Ghz. To support such switching times, local energy storage is utilized to provide the energy for switching. This energy storage is generally implemented using local decoupling capacitors connected between power and ground. However, conventional capacitor devices are quite large, utilizing 5 or more poly grid spaces to implement, thus decreasing the space available for other devices or increasing the physical size, which causes larger parasitic losses and thus, greater energy consumption.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

Figure 1:
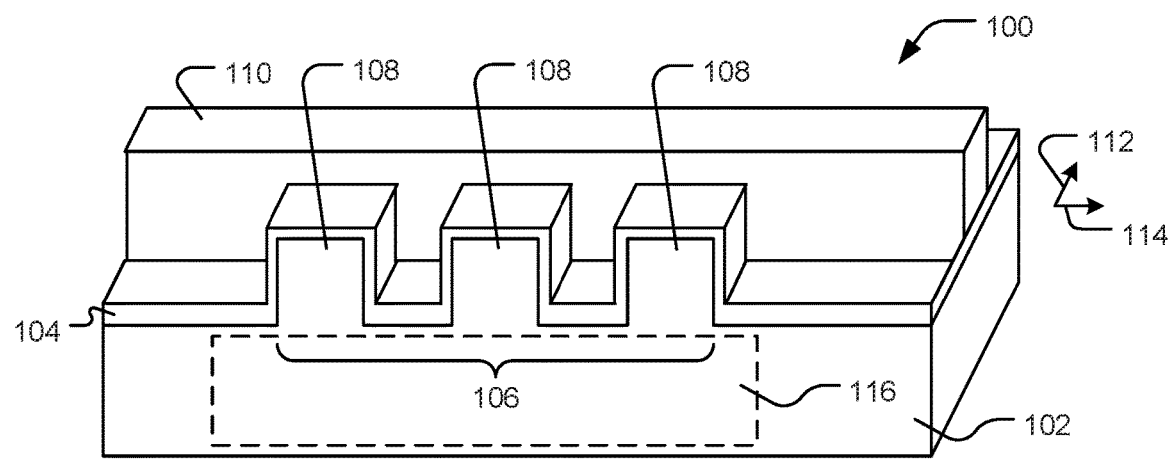
FIG. 1 is an illustration of example fin structures in a FinFET device.

Digital circuits are implemented using FinFET technology using a standard cell approach. In this approach, standard logic functions such as NAND gates, NOR gates, FLIP-FLOPs, and more complex logic functions are implemented and then used to construct more complex functions such as central processing units (CPUs) or complex interface logic, for example, a universal serial bus (USB) interface. These standard cell functions are constructed using a boundary structure that enables more precise modeling of the performance and power consumption of the standard cells. These boundary structures are generally constructed using dummy devices (e.g., edge fins), which conventionally have no electrical function, but are present to enable a known environment for which the electrically significant devices in the cell can operate. The dummy devices eliminated the concern for how other cells placed in the vicinity of the standard cell affect the function being implemented. These dummy devices, which provide this known environment, are also present to ensure regularity of the critical structures such that effective and repeatable printing of the layers that constitute the devices can be achieved.

As described herein, the dummy devices (e.g., edge fins) can be used to generate decoupling capacitors to support energy storage utilized for high speed switching. Such use of the dummy devices also extends to utilize standard cell placement areas smaller than the placement areas in which conventional standard cell decoupling capacitors are implemented. As such, smaller areas that are normally filled with dummy devices (e.g., edge fins) can be used to support energy storage in support of high-speed switching.

FIGS. 1-13 illustrate exemplary circuitry including decoupling capacitors and methods for making circuitry that includes decoupling capacitors. In some embodiments, the circuitry includes two devices and a capacitor defined in a space between the two devices. In some embodiments, a semiconductor apparatus can be formed to include decoupling capacitors defined between adjacent FinFET device cells using edge fins of the FinFET device cells. In some embodiments, the edge fins of the FinFET device cells are connected to a ground rail, a power rail, or to each other to form capacitors.

For example, each device cell can include sets of active region device fins and a gate fin disposed across the active region device fins. An edge of each device cell is defined by an edge fin, referred to as polysilicon-on-device-edge devices. Edge fins of adjacent device cells can be used to form a capacitor in a space between the device cells. Edge fins of adjacent device cells can be used to form a capacitor by coupling the edge fins to a power rail, a ground rail, or each other.

In some embodiments, a capacitor is formed by connecting an edge fin of one device cell to power and an edge fin of the adjacent device cell to ground. In some embodiments, a metal rail interconnect is formed between edge fins of adjacent device cells. When the edge fins of adjacent device cells are electrically coupled, a capacitor is formed between the coupled edge fins and the rail interconnect. In some embodiments, a set of device fins can be disposed under the edge fins of adjacent device cells. The edge fins of the adjacent device cells can be electrically coupled together or coupled to one of the power rail or ground rail. The set of interstitial device fins can be connected to another of the power rail or ground rail, thereby forming a capacitor.

In some embodiments, a method of forming a semiconductor circuitry includes forming a set of active region device fins over a substrate and extending in a first planar direction. An insulator can be formed over the set of device fins. A gate fin and edge fins can be formed to extend in a second direction and over the active region device fins. The edge fins of adjacent device cells can be connected to a power rail, a ground rail, or to each other. Further, rail interconnects can be formed and can optionally be connected to other metal layers or a source or drain of the active region device fins.

FIG. 1 illustrates an exemplary FinFET structure 100. The structure includes a substrate 102. The substrate 102 can, for example, be a silicon substrate. Alternatively, other semiconductor materials can be used. Optionally, the substrate is disposed over an insulator, forming a silicon-on-insulator (SOI) structure.

A set 106 of device fins 108 can be formed over the substrate 102. For example, the device fins 108 can be formed of a polysilicon material similar to the material of the substrate 102. The device fins 108 extend in a planar direction 112. Further, the substrate 102 or device fins 108 can be doped to form n-type or p-type materials. Optionally, regions 116 of the substrate 102 horizontally adjacent to and partially underlying the fins 108 can be doped with an implant to form a source or drain. Alternatively, source and drain regions can be formed in material (not illustrated) overlying or surrounding ends of the device fins 108.

An insulator 104 can be disposed over the substrate 102 and the device fins 108. The insulator 104 can be thicker on horizontal surfaces over the substrate 102 and thinner over the device fins 108. In an example, the insulator is an oxide of silicon. The thin insulator over the surface of the device fins 108 can act as a gate insulator or gate oxide.

The structure 100 further includes a fin 110 extending in a second planar direction 114. The fin 110 extends across and partially surrounds the device fins 108. In an example, the fin 110 can form a gate fin.

The fin 110 and the underlying device fin 108 separated by the insulator layer 104 between the fin 110 and the underlying fins 108 constitute the FinFET structure. FIG. 1 illustrates three fin structures constructed with the gate node or poly finger (fin 110) common to all three devices. These device fins 108 are identical in structure whether they are used as active functional devices or dummy devices. The function of the FinFET is determined by the manner in which the device fins 108 and the fin 110 are electrically connected. Depending upon the configuration of electrical interconnects connected to the device fins 108 and the fin 110, the fin 110 can act as a gate electrode. In some embodiments, the fin 110 can act as an element of a capacitor with the device fins 108 acting as the other element of the capacitor. In a further example, the fin 110 can be an edge fin disposed at an edge of a FinFET device cell, described in more detail below. The fin 110 can optionally include an additional insulator (not illustrated) disposed on the sides of the fin 110.

In conjunction with other conductive elements, semiconductive elements, electrical interconnects, and other FinFET structures, the structure 100 can be used to form capacitors, transistors, or more complex devices, such as inverters. A source can be connected to one end of the device fins 108 and a drain connected to an opposite end of the device fins 108, creating a transistor structure. Such transistor structures can be utilized in a variety of configurations with other transistor structures and capacitors to form more complex devices.

Figure 2:
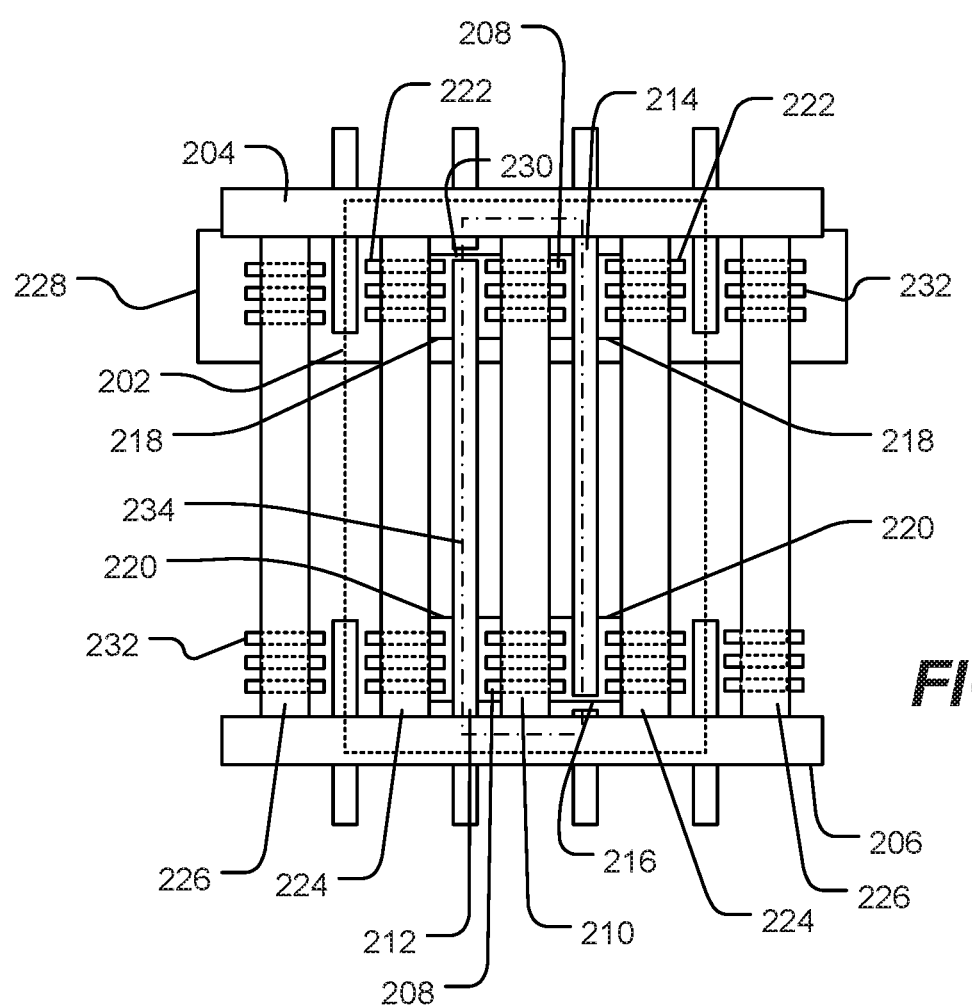
FIG. 2 is an illustration of an example FinFET device.

FIG. 2 is an illustration of a FinFET cell structure. The FinFET cell 202 is disposed between power and ground rails 204 and 206. Within the cell 202, a FinFET device 234 includes device fins 208 and a gate fin 210 disposed over the device fins 208. The device fins 208 can be coupled to source and drain regions within the underlying substrate or formed within material disposed adjacent, around, or over the device fins 208. In an example, a set of device fins 208 is coupled to doped regions 220 forming a source and drain. In another example, doped regions 218 can form a source and drain and are disposed within an oppositely doped well 228. Depending upon the nature of the underlying device, the doped regions 218 and 220 can be formed of p-type material or an n-type material. In a particular example, the doped regions 220 are an n-type material. In a further example, the doped well 228 is formed of n-type material and doped regions 218 are formed of p-type material.

Interconnects 212 or 214 can connect source and drain regions of the FinFET device 234 to the power or ground rails 204 or 206. For example, the rail interconnect 212 can extend to contact doped regions 218 and 220 and have a cut 230 preventing connection to the rail 204. Similarly, the rail interconnect 214 can extend to contact different doped regions 218 and 220 and have a cut 216 to prevent connection with the rail 206. Depending upon the nature of the FinFET device 234, the rail interconnects can be shaped and cut in various configurations to provide various device configurations to form, for example capacitors, transistors, inverters, or other complex devices. Further, the device 234 can include more than one set of device fins 208 and gate fins 210.

In the illustrated cell 202, the device 234 is disposed between edge fins 224. Optionally, the edge fins 224 overlie device fins 222 not actively used in the device 234. The configuration can further include spacer fins 226 that optionally overlie device fins 232 not associated with or actively used in the device 234. The spacer fins 226 are not immediately adjacent to a device, such as the device 234. Alternatively, device cells, such as cell 202, can be positioned directly adjacent so that the edge fin 224 of one device cell is directly adjacent an edge fin of an adjacent device cell without spacer fins 226.

As described in more detail below, the edge fins 224 of adjacent device cells and optionally spacer fins 226 disposed between device cells are utilized as energy storage capacitors to supply switching energy to active devices. The edge fins 224 and optional spacer fins 226 can be utilized to form capacitors between edge fins or edge fins and spacer fins. In further configurations, edge fins and spacer fins with associated underlying device fins can be utilized to form such storage capacitors.

Figure 3:
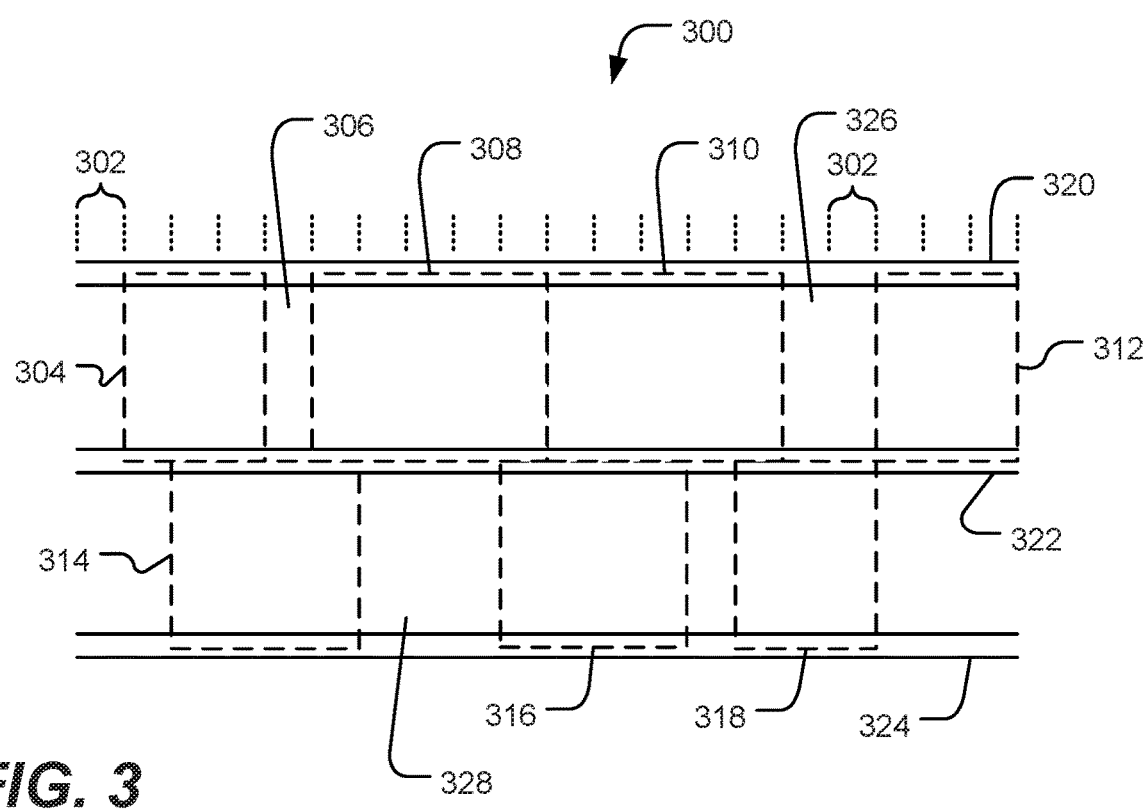
FIG. 3 is an illustration of an example grid-spaced cell layout.

FIG. 3 is an illustration of an example of a cell-based layout placement diagram 300 in which a set of device cells can be arranged in a grid pattern. Power rails 320, 322, and 324 separate the cell placement in one direction and device cells are laid out according to a planar grid spacing 302 in a second direction. The cells, such as cells 304, 308, 310, 312, 314, 316, and 318 (represented by the broken lines), are laid out according to the planar grid spacing 302 between rails 320, 322, and 324. The cells 314, 316, and 318 have an orientation that is electrically flipped relative to the cells 304, 308, 310, and 312 as a result of the orientation of the rails.

The rails 320, 322, or 324 can alternatively be powered or coupled to ground. In particular, the rails 320 and 324 are connected to the same potential source (ground or power). For example, rails 320 or 324 can be coupled to power and rail 322 can be coupled to ground.

Each of the cells 304, 308, 310, 312, 314, 316, and 318 can include an active FinFET device, including active fins and at least one gate fin, and can include edge fins. The devices can be capacitors, transistors, or more complex devices, such as inverters.

Cells are placed on the intersection of the vertical and horizontal placement grids to comply with printing and manufacturing restrictions. In this placement, some cells are directly abutted (directly adjacent) and some cells have spaces between cells adjacent in the horizontal direction.

For example, each of the cells occupies a number of grid spaces. In an example, the cell 304 is illustrated as occupying three grid spaces, whereas the cells 308 and 310 are illustrated as occupying five grid spaces. In some embodiments, the cells are directly adjacent or abutting. For example, the cell 308 and the cell 310 are separated by zero grid spaces. In contrast, the cell 304 is separated from the cell 308 by a single grid space 306. In a further example, the cell 310 is separated from the cell 312 by a space 326 of two grid spaces, and the cell 314 is separated from the cell 316 by a spacing 328 of three grid spaces.

As described in more detail below, the device cells, such as device cells 304, 308, 310, 312, 314, 316 or 318, are FinFET structures that utilize edge fins at the edge of each device cell. Such edge fins are used to form capacitor structures in the gaps or spaces between adjacent device cells. In an example, the adjacent device cells can have a zero-grid space separation, and thus, are directly adjacent. In other examples, the device cells are adjacent with up to four grid spaces between the device cells.

Figure 4:
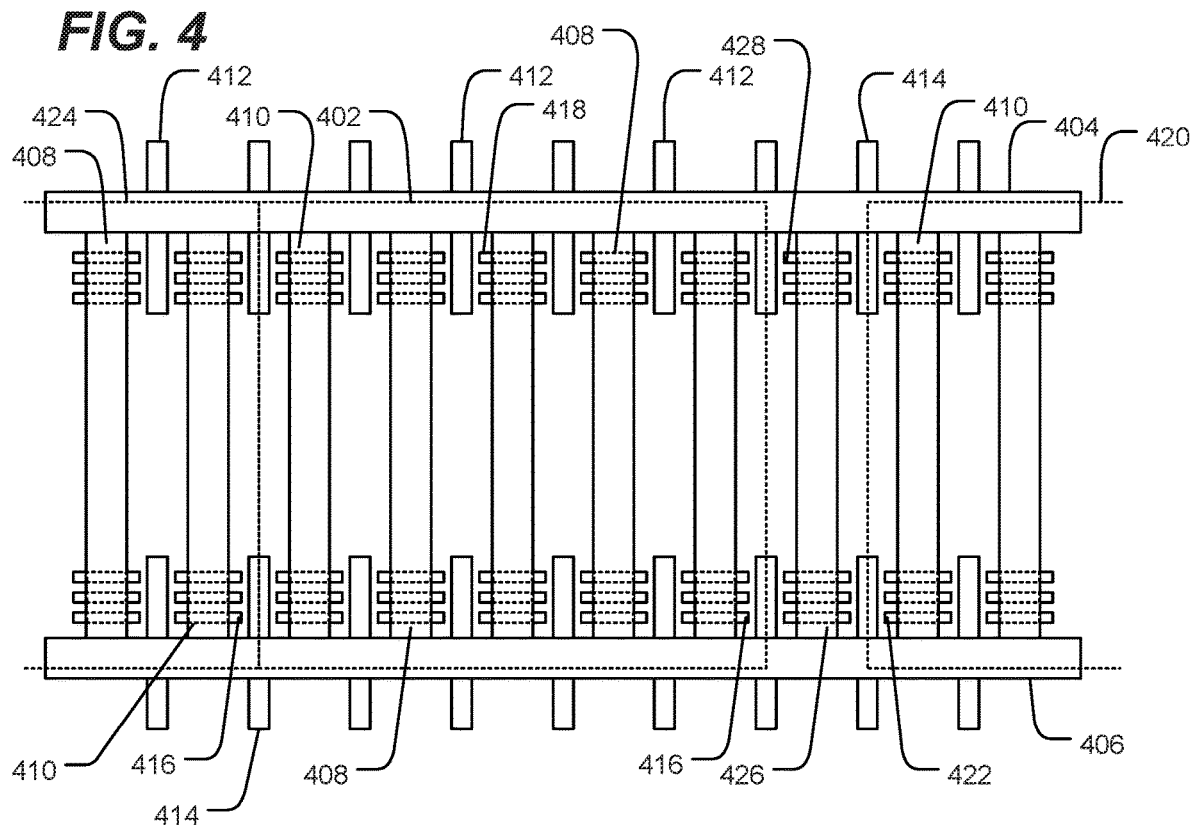
FIG. 4 is an illustration of an example device.

FIG. 4 illustrates an exemplary layout of device cells and associated FinFET structures. Using additional metal or semiconductor layers (not illustrated) and through layer interconnects, such FinFET structures can be utilized to form capacitors, transistors, or more complex devices, such as inverters. As illustrated, a device cell 402 is immediately adjacent device cell 424. The device cell 402 is separated by from device cell 420 by one grid space. Each of the device cells 402, 420, and 424 is disposed between a power rail 404 and a ground rail 406. The device cells 402, 420 and 424 are also laid out according to a grid spacing, extending horizontally as illustrated. The device cells 402, 420, and 424 include gate fins 408 and sets of active region device fins 416 or 418. The active region device fins 416 and 418 or portions of the underlying substrate in the region around the device fins 416 or 418 can be doped to including n-type or p-type materials. In an example, the device fins 416 have an opposite doping type than the device fins 418.

Further, the device cell 402 includes rail interconnects 412 that can be utilized to connect various structures, such as the active region device fins 416 or 418 or the gate fins 408 to the power rail or ground rail (404 or 406), using various other metal or semiconductor structures and interconnects (not illustrated). The rail interconnects 412 can be shortened or extended as appropriate for the form a desired device.

Each of the device cells 402, 420, or 424 further includes an edge fin 410. In an example, the edge fin 410 can be formed of a polysilicon. In such a configuration, the device cells 402, 420 or 424 are referred to as polysilicon-on-device-edge devices. Optionally, a spacer fin 426 can be disposed between device cells. Optionally, interstitial rail interconnects 414 can be disposed in the gap between adjacent devices. In a further example, interstitial device fins 428 can underlie the edge fins 410 of adjacent device cells or the spacer fin 426.

Such edge fins 410 can be utilized with the edge fins 410 of adjacent device cells to form additional decoupling capacitor structures between adjacent device cells. For example, an edge fin 410 of the device cell 402 can be configured to work cooperatively with an edge fin 410 the device cell 424 to form various capacitor structures. In an example, the adjacent edge fins 410 can be coupled to a different rail. One edge fin 410 can be coupled to a power rail and the other adjacent edge fin 410 can be coupled to a ground rail, forming a capacitor between the two adjacent edge fins. In another example, the adjacent edge fins can be electrically coupled together using a conductive element (not illustrated) and define a capacitor structure between the coupled edge fins and one or both of interstitial rail interconnects 414. In some embodiment, the edge fins 410 can be coupled to one of the power or ground rail and can thus form capacitance relative to an interstitial rail interconnect 414 or conductive structures attached thereto. In a further example, the edge fins 410 of adjacent device cells can be electrically coupled together and form capacitance with spacer fins, such as the spacer fin 426.

Figure 5:
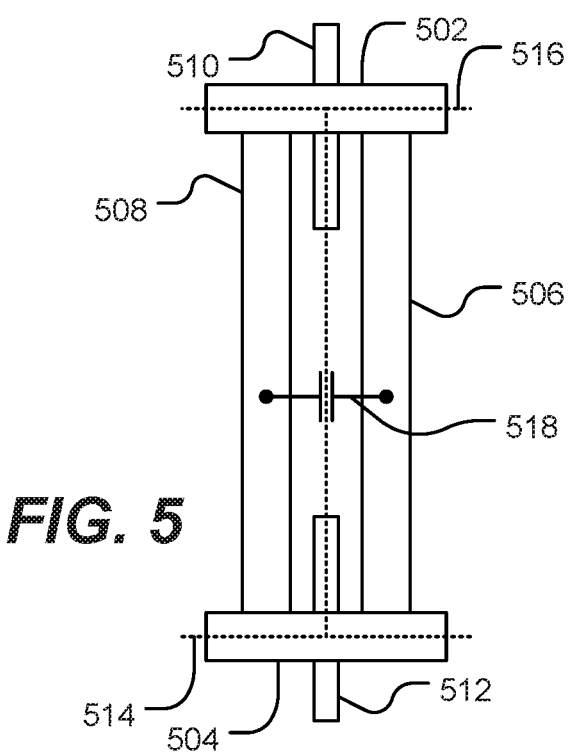
FIG. 5, FIG. 6, and FIG. 7 are illustrations of example capacitor structures.

FIG. 5 illustrates an exemplary capacitor structure defined between two immediately adjacent device cells 514 and 516 with a grid spacing gap of zero. The edge fin 506 of the device cell 516 and the edge fin 508 of the device cell 514 can be utilized to form capacitor structures by being electrically connected to a ground rail 504, a power rail 502, or to each other. For example, the edge fin 506 can be electrically connected to the power rail 502, and the edge fin 508 can be electrically connected to the ground rail 504 or vice versa. In such an example, capacitance 518 is formed between the edge fin 508 and the edge fin 506. Optionally, the rail interconnects 510 or 512 can be utilized to electrically connect the edge fins 506 or 508 to the associated ground or power. For example, the rail interconnect 510 can be utilized to electrically connected the power rail 502 to the edge fin 506 utilizing additional conductive layers (not illustrated). The edge fin 508 can be electrically connected to the ground rail 504 utilizing the rail interconnect 512 and additional intermediate conductive structures (not illustrated). As such, a capacitor structure can be formed between the edge fin 506 and the edge fin 508.

In another example, the edge fins 506 and 508 can each be coupled to the same rail or one of the rail interconnects 510 or 512 and the other of the rail interconnects 510 or 512 can be extended. As such, the edge fins 506 and 508 can form a capacitor structure relative to the extended rail interconnect. For example, the edge fins 506 and 508 can be connected together using a conductive structure (not illustrated). Optionally, that conductive structure can be connected to one of the rail interconnects, such as the rail interconnect 512. The rail interconnect 510 can be extended or can be attached to another structure separated from the edge fins 506 and 508 by an insulator. As such, the edge fins 506 and 508 can form a capacitor relative to the rail interconnect 510.

Figure 6:
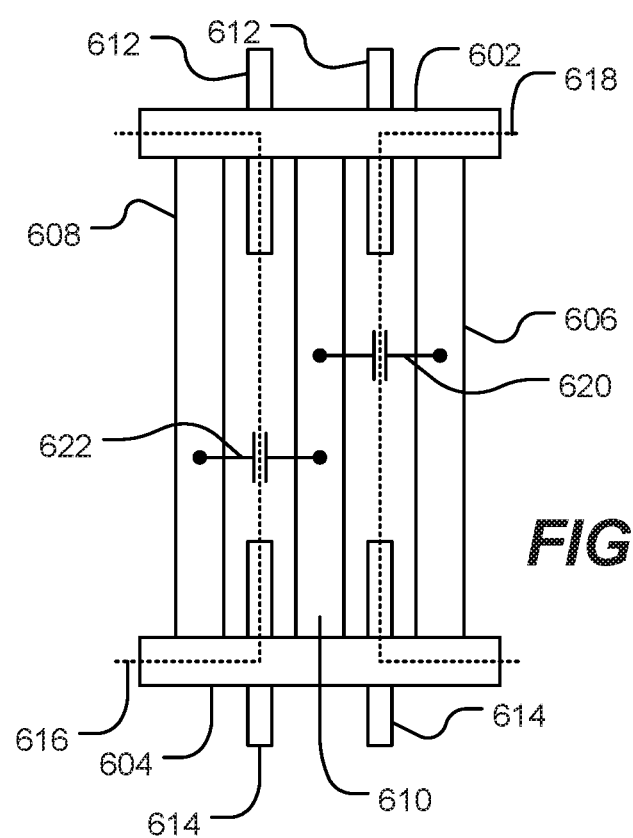

FIG. 6 illustrates an exemplary configuration in which device cells 616 and 618 are separated by a gap size of one gap spacing. A spacer fin 610 is disposed between the edge fins 606 and 608 and extends in the same planar direction as the edge fins 606 and 608. Optionally, a power rail 602 is connected to rail interconnects 612, and a ground rail 604 is connected to rail interconnects 614.

In some embodiments, the edge fins 606 and 608 can be coupled to one of the power rail 602 or ground rail 604, and the spacer fin 610 can be electrically connected to the other of the power rail 602 and the ground rail 604. Such connections can be made utilizing the rail interconnects 612 or 614 and additional conductive structures (not illustrated). In such an embodiment, the edge fins 606 and 608 form capacitance 620 or 622 with the spacer fin 610.

In some embodiments, each of the edge fins 606 and 608 and the spacer fin 610 can be connected to the same rail or can be connected to each other and form a capacitance relative to the rail interconnects connected to the opposite rail. For example, the fins 606, 608, and 610 can be each connected together utilizing a conductive layer (not illustrated). In another example, the fins 606, 608, or 610 can each be electrically connected to the power rail 602. As such, the fins 606, 608, and 610 form a capacitor relative to the rail interconnects 614 coupled to ground 604.

Figure 7:
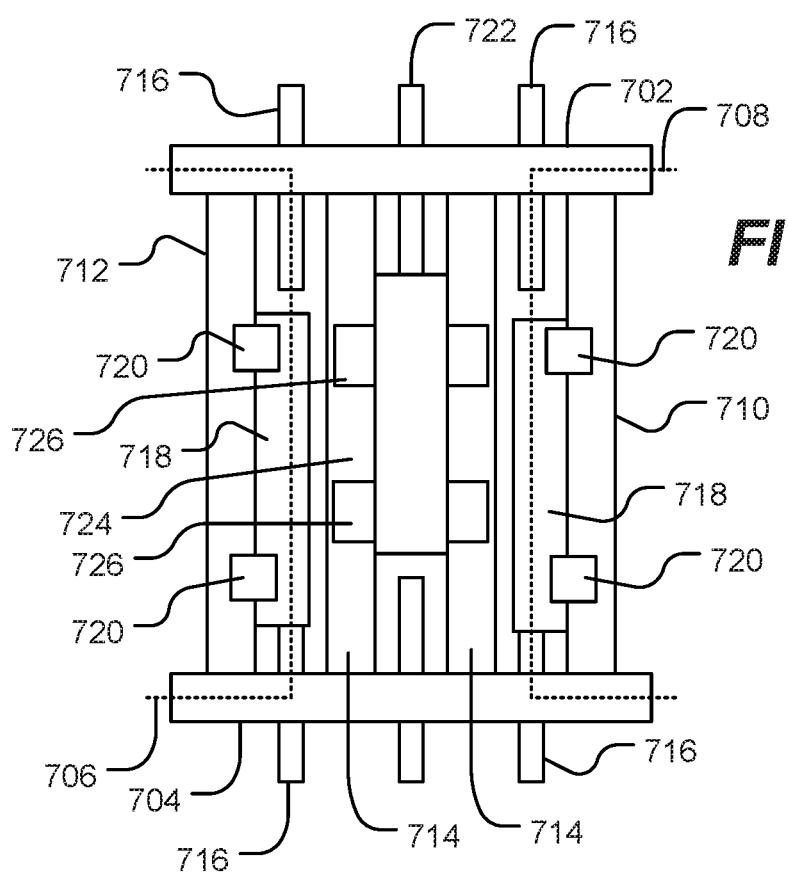

FIG. 7 illustrates an example decoupling capacitor formed between device cells 706 and 708, which are separated by a grid spacing of two grid spaces and disposed between the power rail 702 and the ground rail 704. In the illustrated example, the edge fin 710 of the device cell 708 and the edge fin 712 of the device cell 706 each connected to the ground rail 704 utilizing rail interconnects 716 connected to conductive structures 718 and interconnects 720. The spacer fins 714 are each electrically connected to the power rail 702 utilizing rail interconnect 722 connected to a conductive structure 724 and interconnects 726. As such, capacitors are formed between the edge fins 710 or 712 and the spacer fins 714. Alternatively, the edge fins 710 or 712 can be electrically connected to the power rail 702 and the spacer fins 714 can be electrically connected to the ground rail 704.

Figure 8:
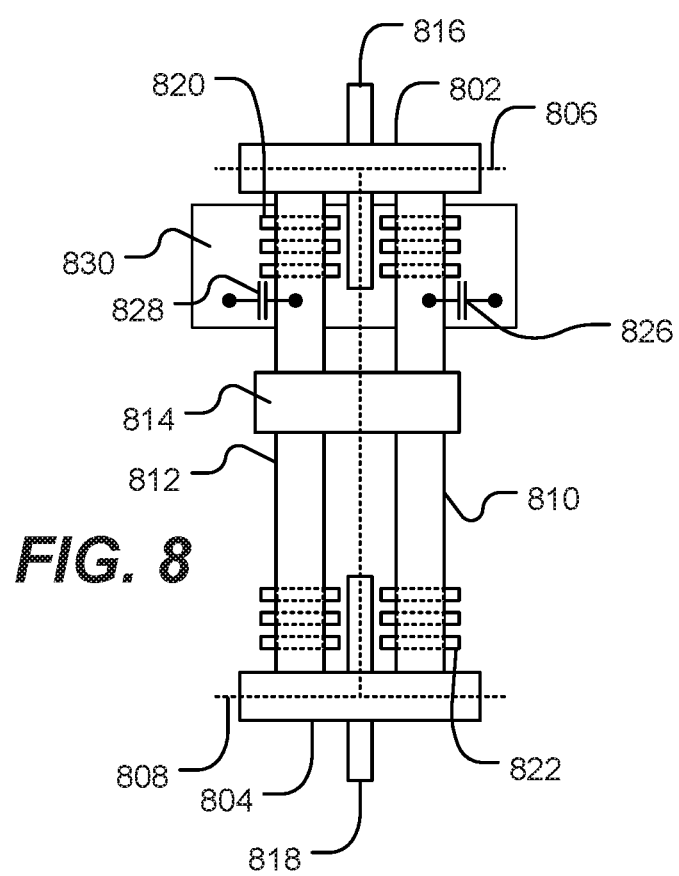
FIGS. 8-12 are illustrations of example capacitor structures.

In some embodiments, sets of interstitial fins can be formed and have similar structure to the active region fins of the devices. Such sets of interstitial fins can be utilized to form capacitors relative to the edge fins of the device cells. For example, as illustrated in FIG. 8, adjacent device cells 806 or 808 can be separated by a zero-grid spacing. Sets of interstitial device fins 820 and 822 can underlie the edge fins 810 and 812 of the device cells 806 and 808 and can extend orthogonally relative to the edge fins 810 and 812. Optionally, the edge fins 810 or 812 can be electrically connected utilizing a conductive element 814. Further, the rail interconnects 816 or 818 can be connected to the sets of interstitial device fins 820 or 822 or can be connected to the edge fins at 810 or 812 and configured to create capacitance 826 or 828 between the edge fins 810 or 812 and the sets of interstitial device fins 820 or 822 and underlying doped material 830.

Figure 9:
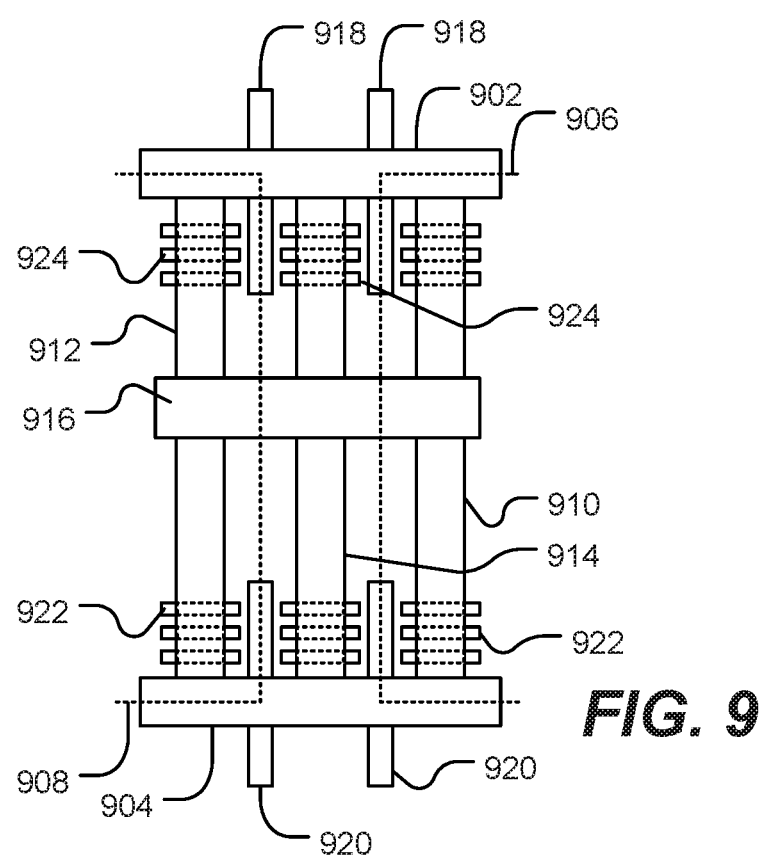

FIG. 9 illustrates a further embodiment in which the device cells 906 and 908 are separated by a gap of one grid spacing. A spacer fin 914 is disposed between the edge fin 910 of the device cell 906 and the edge fin 912 of the device cell 908. Optionally, the edge fins 910 and 912 and the spacer fin 914 are connected by a conductive element 916. Sets of interstitial device fins 924 and 922 are disposed to underlie the edge fins 910 or 912 or the spacer fin 914 and extend in a direction orthogonal to the edge fins 910 or 912 or the spacer fin 914. The sets of interstitial device fins 924 can differ from the sets of interstitial device fins 922 based on a doping and conductivity type (e.g., n-type or p-type).

In addition, the system includes rail interconnects 918 connected to the power rail 902 and rail interconnects 920 connected to the ground rail 904. Depending upon the electrical interconnects tied to the edge fins 910 or 912 and spacer fin 914 and the interconnects or electrical connections to the interstitial device fins 922 or 924, a capacitor structure can be formed between the fins 910, 912, and 914 and the sets of interstitial device fins 922 or 924.

Figure 10:
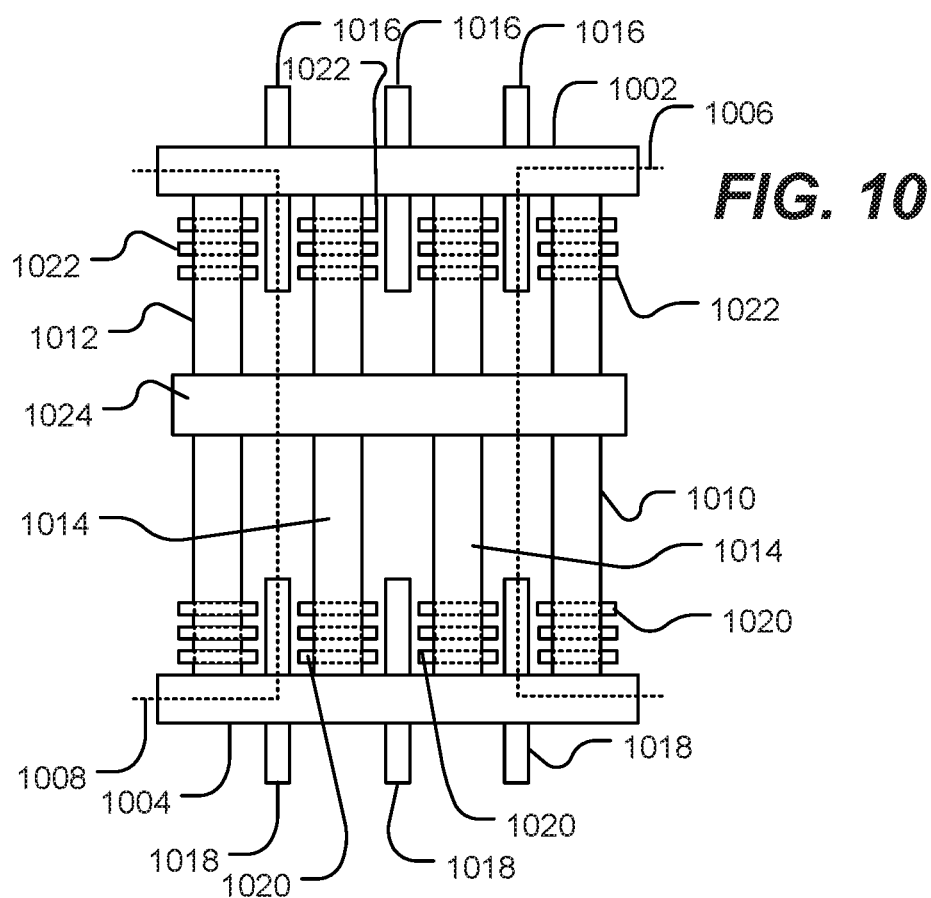

FIG. 10 illustrates an embodiment in which adjacent device cells 1006 and 1008 are separated by a grid spacing of two grid spaces. An edge fin 1010 of the device cell 1006 and an edge fin 1012 of the device cell 1008 are separated by spacer fins 1014. In an example, each of the fins 1010, 1012, and 1014 are connected by a conductive structure 1024. Sets of interstitial device fins 1020 or 1022 are disposed to underlie the fins 1010, 1012, and 1014. Depending on the desired configuration, the fins 1010, 1012, or 1014 can be connected to one of the power rail 1002 or the ground rail 1004. The sets of interstitial device fins 1020 or 1022 can be connected to the other of the power rail 1002 or the ground rail 1004 utilizing a rail interconnect 1016 or 1018. As such, the fins 1010, 1012 and 1014 can form a capacitor with the interstitial device fins 1020 or 1022.

Figure 11:
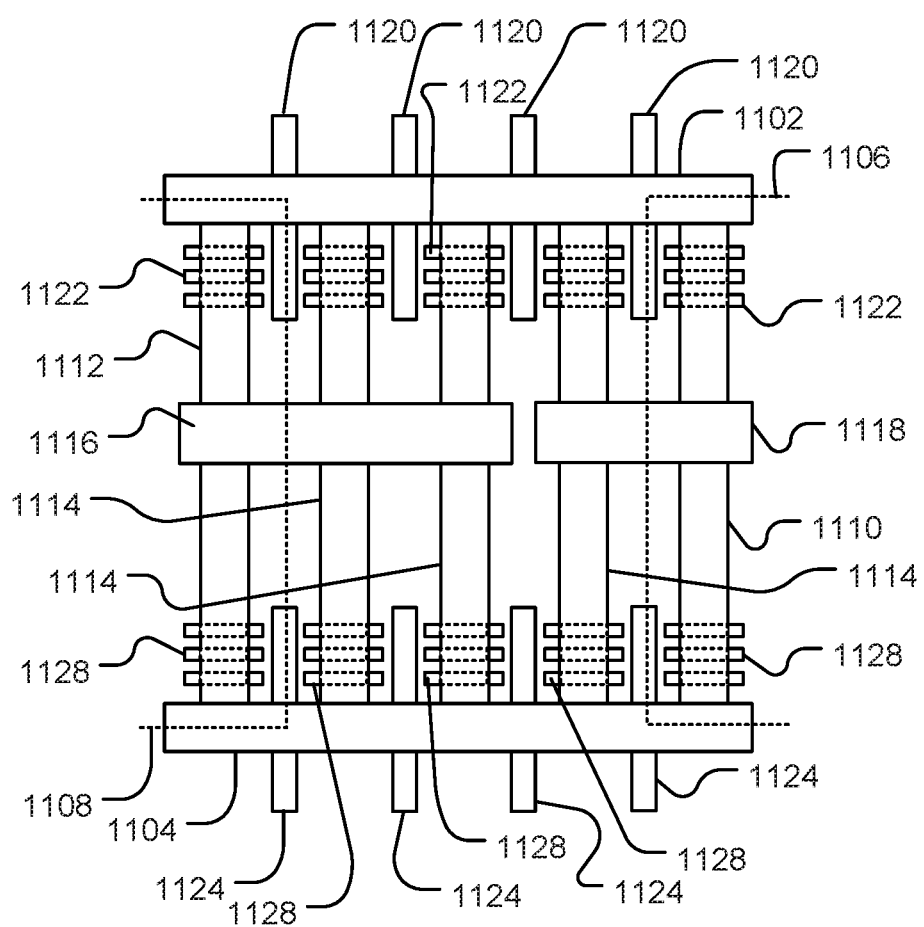

FIG. 11 illustrates a configuration in which the spacing between adjacent device cells 1106 and 1108 is three grid spaces. The edge fins 1110 and 1112 are separated by three spacer fins 1114. Sets of interstitial device fins 1122 and 1128 extend in opposite planar direction relative to the fins 1110, 1112, or 1114. As illustrated, the edge fin 1112 of the device cell 1108 can be connected to two of the spacer fins 1114 by a conductive structure 1116. The edge fin 1110 of the device cell 1106 can be connected to one of the spacer fins 1114 by a conductive structure 1118. Depending upon the interconnects between the power rail 1102 utilizing rail interconnects 1120 or the ground rail 1104 utilizing the rail interconnects 1124, a capacitance structure can be formed between the fins 1110, 1112 and 1114 relative to the sets of interstitial device fins 1122 or 1128.

Figure 12:
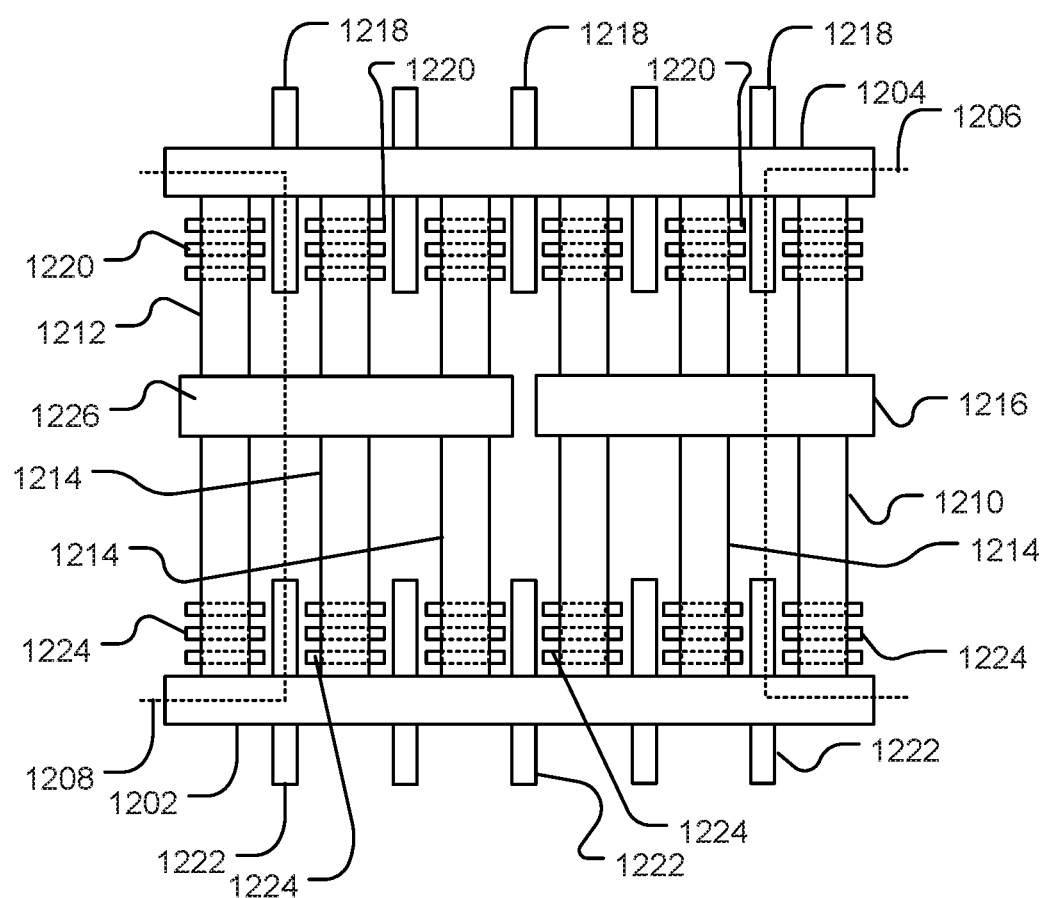

In a further embodiment, FIG. 12 illustrates a configuration in which the device cells 1206 and 1208 are separated by a gap of four grid spaces. The edge fin 1210 of the device cell 1206 is connected to two of the spacer fins 1214 by a conductive structure 1216. Similarly, the edge fin 1212 of the device cell 1208 is connected to two other spacer rails 1214 by a conductive element 1226. As above, sets of interstitial device fins 1220 or 1224 can be utilized to form capacitance structures relative to the edge fins 1210 and 1212 or spacer fins 1214 depending upon their coupling to a power rail 1204 utilizing a rail interconnect 1218 or to a ground rail 1202 using utilizing rail interconnect 1222.

Figure 14:
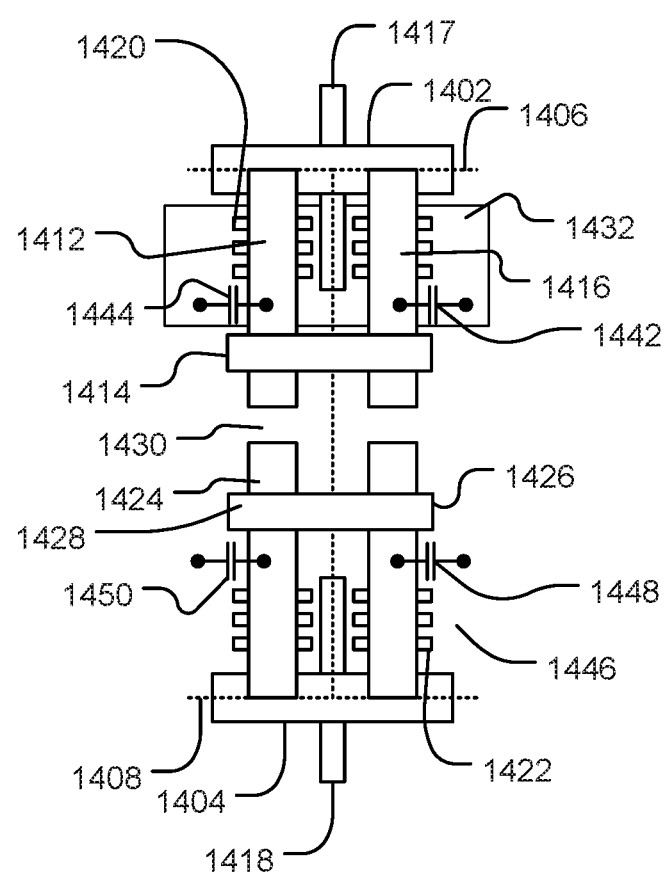
FIG. 14 is an illustration of an example capacitor structure.
Figure 15:
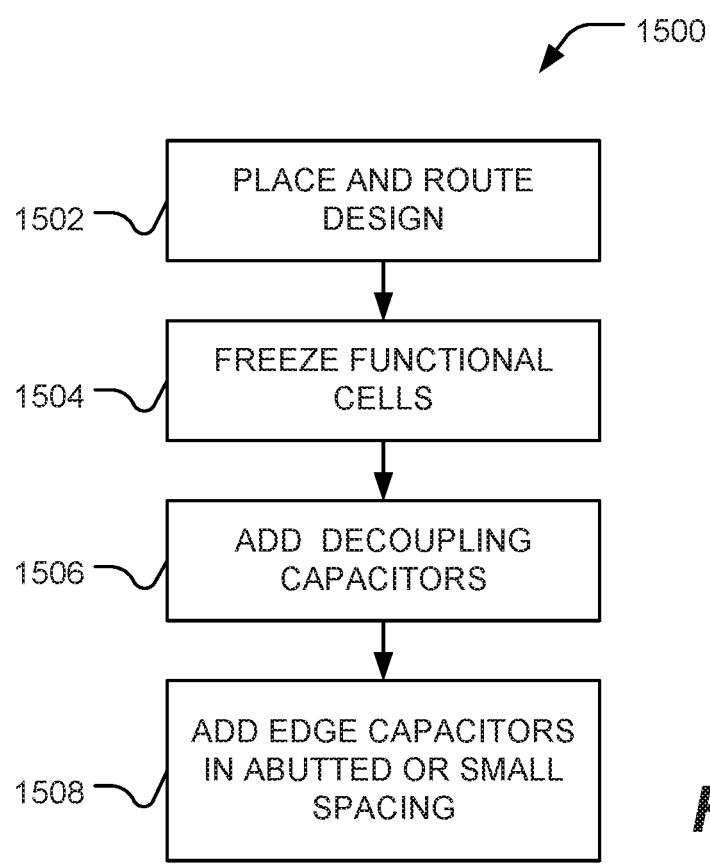
FIG. 15 is a block flow diagram of an example method for designing a capacitor structure.

In some embodiments, the edge fins or spacer fins can be cut to electrically separate portions of the edge or space fins. Such cut edge or spacer fins can be used to form two capacitors; one with a sets of interstitial fins overlying an n-type material and one with a set of interstitial fins overlying a p-type material. For example, as illustrated in FIG. 14, adjacent device cells 1406 or 1408 can be separated by a zero-grid spacing. Sets of interstitial device fins 1420 and 1422 can underlie the edge fins of the device cells 1406 and 1408 and can extend orthogonally relative to the edge fins. Optionally, the edge fins can be cut (1430) to form electrically separate portions. For example, the edge fin of the device cell 1408 can be cut to form portions 1412 and 1424, and the edge fin of the device cell 1416 can be cut to form portions 1416 and 1426. The rail interconnects 1416 or 1418 can be connected to the sets of interstitial device fins 1420 or 1422 or can be connected to the portions of the edge fins and configured to create capacitance between the portions of the edge fins and the sets of interstitial device fins 1420 or 1422. In the illustrated embodiment, the edge fin portions 1412 and 1416 can be connected together utilizing a conductive element 1414 and can overlie interstitial fins 1420 which overlie a doped well 1432, such as an n-type well. When the doped well 1432 is connected to rail 1402 and the portions 1412 and 1416 are connected to the rail 1404, capacitance 1442 and 1444 is formed. In another example, portions 1424 and 1426 can be connected utilizing a conductive element 1428. When the substrate 1446 is connected to rail 1404 and the portions 1424 and 1426 are connected to rail 1402, a further capacitance 1448 and 1450 is formed. While FIG. 14 illustrates a zero-grid spacing, other embodiments can include spacer fins that are cut to form portions that can be connected in a manner to form capacitors with interstitial fins and underlying dopes structures.

Figure 13:
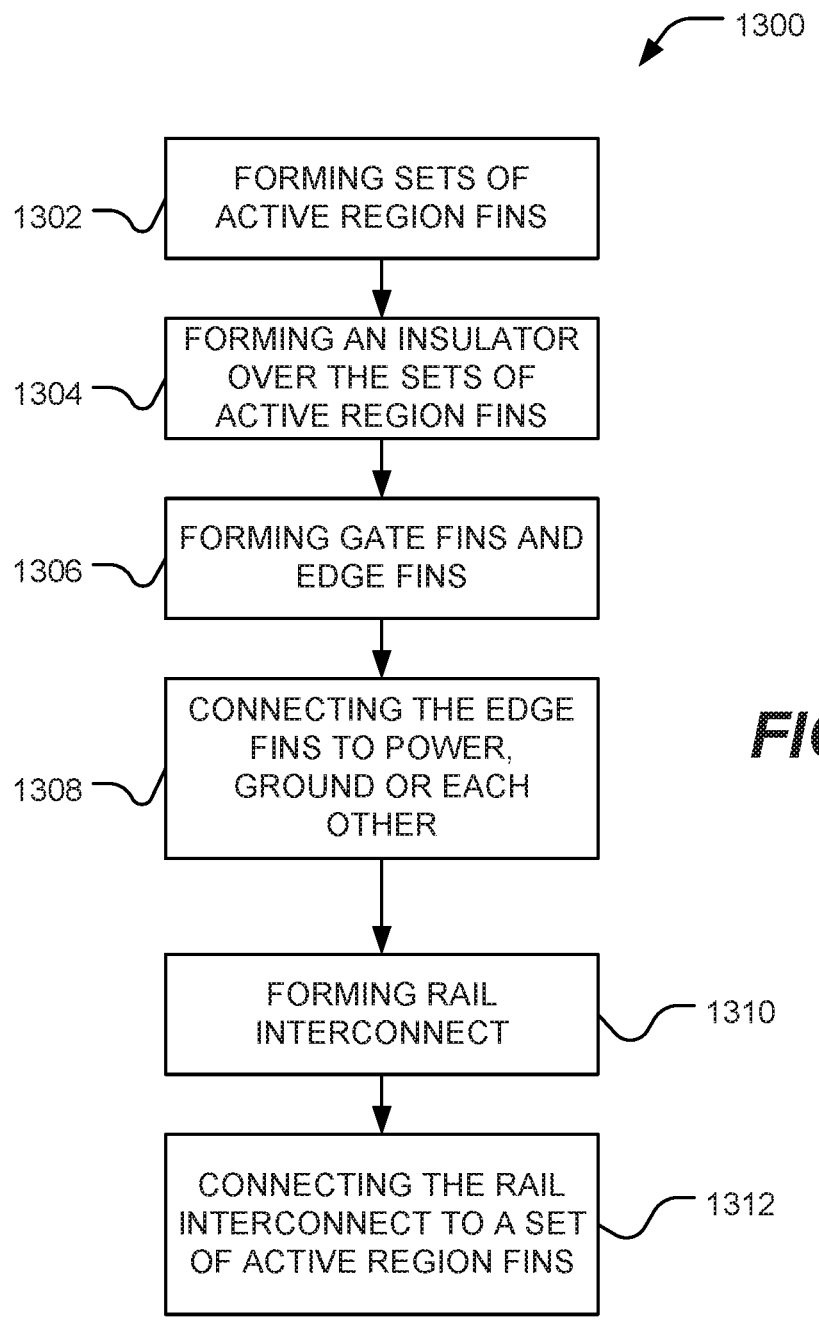
FIG. 13 is a block flow diagram of an example method for forming a capacitor structure.

Various embodiments of the above decoupling capacitors can be formed in accordance with a method 1300 illustrated in FIG. 13. As illustrated at block 1302, sets of active region device fins can be formed. For example, the active region device fins can be formed of a polysilicon disposed over a polysilicon substrate and patterned to form three-dimensional fins. Optionally, additional interstitial device fins can be formed at the same time that the active region device fins are being formed. Portions of the active region can be doped with an implant.

As illustrated at 1304, an insulator can be formed over the sets of active region device fins and optionally the sets of interstitial device fins. For example, an oxide of silicon can be deposited in a layer over the substrate and active region fins. Optionally, this process is carried out in two steps to provide a greater thickness of the insulator over the substrate and a thinner thickness of the insulator over the active region device fins.

The gate fins and edge fins of the device cells can be formed, as illustrated at 1306. Such gate fins and edge fins are formed to extend in an opposite planar direction relative to the active region device fins and optional spacer fins. In gaps or spaces between device cells, additional spacers fins can be formed when the gate and edge fins are being formed. In particular, forming the gate and edge fins and optional spacer fins, can be performed by depositing and patterning a polysilicon fin. Optionally, an additional insulator is formed on sides of the gate or edge fins or the spacer fins.

Depending on the configuration of the desired decoupling capacitor structure, the edge fins can be electrically connected to power, ground, or each other. For example, one adjacent edge fin can be electrically connected to power and another adjacent edge fin can be electrically connected to ground. Alternatively, the edge fins can be electrically connected to each other and a capacitor formed relative to interstitial device fins.

As illustrated at block 1310, rail interconnects can be formed. Depending upon the configuration of the decoupling capacitor, the rail interconnect can be connected to other interconnect and conductive structures to connect and configure the decoupling capacitor. For example, the rail interconnect can be connected to a set of active region device fins, as illustrated at block 1312, utilizing conductive layers and interconnects. Alternatively or in addition, a rail interconnect can be connected to an edge fin or spacer fin.

In a further example, a method 1500 for designing edge capacitors as illustrated in FIGS. 1-12 and FIG. 14 includes preparing a place and route design, as illustrated at block 1502. The placement of electronic components, circuitry, and logic elements in a limited amount of space is determined. This is followed by routing, in which the design of conductive elements and interconnects to connect the placed components is determined. In general, the desired connections are configured, while following the rules and limitations of the manufacturing process.

As illustrated at block 1504, the functional cells are frozen. In other words, the placement of the functional cells is fixed and prevented from further translation or displacement.

Decoupling capacitors can be added to large spaces between functional cells, as illustrated at block 1506. In an example, in spaces of five grid spaces or larger, conventional decoupling capacitors can be formed.

As illustrated at block 1508, edge capacitors, such as those illustrated in FIGS. 1-12 and FIG. 14, can be formed between abutted device cells or between device cells having small spacing. For example, edge capacitors can be formed in spaces of not greater than four grid spaces. In particular, edge fins and optionally spacer fins disposed at the edge and between device cells can be used to form additional capacitors, providing further capacitance that can be used for decoupling.

Embodiments of the capacitance structures described herein provide technical advantages. For example, additional decoupling capacitance can be added to the system without additional process steps and utilizing previously unused grid spaces and gaps.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A semiconductor apparatus comprising:
   a first device cell including:
      a first active region including a first set of device fins extending in a first planar direction;
      an insulator layer disposed over the first set of device fins;
      a first gate fin extending in a second planar direction over the first set of device fins; and
      a first edge fin disposed over a first edge of the first active region;
   a second device cell adjacent the first device cell including:

a second active region including a second set of device fins extending in the first planar direction;

the insulator layer disposed over the second set of device fins;

a second gate fin extending in the second planar direction over the second set of device fins; and a second edge fin disposed over a second edge of the second active region, the first edge of the first active region and second edge of the second active region being adjacent;

wherein the first edge fin and the second edge fin are connected to a power rail, a ground rail, or to each other to define a capacitor in a region between the first device cell and the second device cell.

2. The semiconductor apparatus of claim 1, wherein the first and second device cells are adjacent with zero grid spacing between the first and second device cells.

3. The semiconductor apparatus of claim 1, wherein the first and second device cells are adjacent with not greater than four grid spaces between the first and second device cells.

4. The semiconductor apparatus of claim 1, further comprising a spacing fin extending in the second planar direction and disposed in a grid space between the first and second device cells.

5. The semiconductor apparatus of claim 4, wherein the spacing fin is connected to the first and second edge fins.

6. The semiconductor apparatus of claim 4, wherein the spacing fin is connected to another of the power rail or the ground rail relative to the first and second edge fins, defining capacitors between the spacing fin and the first and second edge fins.

7. The semiconductor apparatus of claim 4, further comprising a second spacing fin extending in the second planar direction and disposed in the space between the first and second device cells.

8. The semiconductor apparatus of claim 7, wherein the spacing fin and the second spacing fins are electrically connected to the first and second edge fins.

9. The semiconductor apparatus of claim 7, wherein the spacing fin and the second spacing fin are connected to another of the power rail or the ground rail relative to the first and second edge fins.

10. The semiconductor apparatus of claim 7, wherein the second spacing fin is connected to another of the power rail or the ground rail relative to the spacing fins.

11. The semiconductor apparatus of claim 1, further comprising a first set of interstitial device fins extending in the first planar direction and disposed under the first edge fin and a second set of interstitial fins extending in the first planar direction and disposed under the second edge fin.

12. The semiconductor apparatus of claim 11, wherein the first edge fin and the second edge fin include a cut to form electrically separate portions.

13. The semiconductor apparatus of claim 11, wherein the first edge fin and the second edge fin are electrically connected.

14. The semiconductor apparatus of claim 13, further comprising a rail interconnect in electrical connection with the first and second sets of interstitial device fins, wherein a capacitor is defined between the first and second sets of interstitial device fins and the first and second edge fins.

* * * * *